United States Patent [19]

Lackey

[11] Patent Number: 5,783,960

[45] Date of Patent: Jul. 21, 1998

[54] INTEGRATED CIRCUIT DEVICE WITH IMPROVED CLOCK SIGNAL CONTROL

[75] Inventor: David E. Lackey, Underhill, Vt.

[73] Assignee: International Business Machines Corporation, Armonk, N.Y.

[21] Appl. No.: 893,307

[22] Filed: Jul. 15, 1997

Related U.S. Application Data

[63] Continuation of Ser. No. 563,843, Nov. 28, 1995, abandoned.

[51] Int. Cl.$^6$ ...................................................... H03K 5/13
[52] U.S. Cl. ............................ 327/295; 327/256; 327/259
[58] Field of Search ...................................... 327/291, 293, 327/295, 296, 202, 211–213, 256–259; 326/16; 371/22.3, 22.5

[56] References Cited

U.S. PATENT DOCUMENTS

| | | | |
|---|---|---|---|
| 4,839,604 | 6/1989 | Tanahashi | 327/295 |
| 4,877,974 | 10/1989 | Kawai et al. | 327/295 |
| 5,130,568 | 7/1992 | Miller et al. | 327/202 |
| 5,136,185 | 8/1992 | Fleming et al. | 326/16 |
| 5,175,447 | 12/1992 | Kawasaki et al. | 327/211 |
| 5,463,338 | 10/1995 | Yurash | 327/212 |

*Primary Examiner*—Timothy P. Callahan
*Assistant Examiner*—T. T. Lam
*Attorney, Agent, or Firm*—Schmeiser, Olsen & Watts; Robert A. Walsh

[57] ABSTRACT

A remote clock signal generation means is provided which allows a plurality of clock signals to be generated remotely at the "leaf" level thereby removing the need to have multiple clock signals at the system, or "tree" level. More particularly, this system is designed for use in an LBIST circuit featuring LSSD master-slave clock control. This disclosure teaches a clock control method and structure in which the master and slave clocks are generated directly from the system clock after the clock powering logic to thereby avoid intrusion or modification effects associated with logical manipulation of the clock signals.

16 Claims, 4 Drawing Sheets

1

INTEGRATED CIRCUIT DEVICE WITH IMPROVED CLOCK SIGNAL CONTROL

This application is a continuation of application Ser. No. 08/563,843, filed Nov. 28, 1995, now abandoned.

BACKGROUND OF THE INVENTION

1. Technical Field

The present invention relates to clock signal control for integrated circuits. In particular, the present invention provides improved clock control for built in self-test systems for integrated circuits.

2. Background Art

Advances in integrated circuits have enhanced the ability to integrate increasingly more circuits on a single chip. As the circuit complexity on a chip increases, so does the need to thoroughly test the circuits. A general solution to the problem of testing integrated circuits is to embed test circuitry on the chip itself. This methodology is commonly known as "Logic Built-In Self-Test" (LBIST) and utilizes what is commonly referred to as "Self-Test Using Multiple Signal Registers and Pseudo-Random Pattern Generators" (STUMP) architecture. LBIST circuits typically test a circuit's function and provide a failure indication if the circuit is not functioning properly.

Ideally, such testing systems should provide at least three functional modes which include: 1) an operational mode that allows the chip to perform in its intended manner; 2) a system scan mode that allows for internal system-based testing; and 3) an external scan mode that allows for external input of test data through the chip's pins.

As the number of circuits and logical functions integrated onto a single chip increases, the complexity and sophistication of on-chip LBIST circuits and desired LBIST performance features also increases. One problem that arises in such design relates to clock control. Specifically, known methods for clock control and LBIST-STUMP architecture lead to significant intrusion (e.g. delay, latency, duty cycle alteration) of the system clock signal and either require system data path reduction for at-speed scan operation, or, multiple system clock trees with critical balancing of the timing between the trees.

Edge-triggered design having STUMPs based LBIST capability require a clock control structure for switching between system operational mode and test mode, and for performing a master and slave operation in one system cycle. Such systems require that data be launched from the slave to the combinational logic to be tested, and to capture the result in the master of the next stage. Known methods for achieving such control use logic manipulation of the oscillator signal prior to the clock powering logic. Such systems either use edge-triggered flip-flop with scan multiplexing to manipulate oscillator edges for launch and capture control, or convert the system clock signal into a master and slave clock and separately enable these two clocks for system LBIST test or scan operation. These techniques, however, have significant disadvantages.

Edge-triggered flip-flop clock systems using a straight forward application of edge-triggered design methods present significant intrusion on the oscillator wave form. U.S. Pat. No. 4,961,013 issued to Obermyer, Jr. et al. "Apparatus for Generation for Scan Control Signals for Initialization and Diagnosis of Circuitry in a Computer," discloses such a system. Such systems typically utilize OR and XOR gates which add delay-latency and potential duty cycle alteration due to any rise/fall time imbalance. Furthermore, at-speed scan operation requires system data path reduction caused by data port multiplexer delay. Moreover, reduced speed scan does not help resolve any time violations inherent in scan data paths.

Another common method of implementing LBIST systems involves the use of "Level Sensitive Scan Devices" (LSSD) which feature straight forward applications of master-slave clock control. Under these methods, system clock control is provided by first applying an LSSD testable clock splitter to the oscillator, creating master and slave (C and B) clocks, and then providing AND gates to the C and B clocks for BIST control. Sequencing of C_enb and B_enb provides clock stop/start, BIST capture/launch, and BIST launch/capture operation. Scan control is provided by reusing the above B_enb and adding an A_enb AND gate to the inverted oscillator, thus creating a controllable Scan Master Clock.

The system as just described achieves improved functionality in that a scan operation will run time coincidentally with the product oscillator (i.e. "at-speed") without requiring the introduction of additional logic. In other words, "at-speed" scan operation does not require system data path reduction. Furthermore, reduced speed can be added with additional circuitry to provide wider A and B clocks with wide clock separation to eliminate risk of hold-time violations. However, additional intrusion on the master and slave clocks results. Furthermore, significant disadvantages with this system remain. In particular, significant intrusion on the oscillator wave form still exists since the clock's splitter is followed by the enable gates. Also, such systems require two system clock trees and, thus, additional balancing requirements and impact to the system's performance due to the probable need for clock separation at the clock splitter exist.

Although various patents have attempted to address some of these issues, none provide an efficient means of overcoming the above-identified problems. For instance, U.S. Pat. No. 5,225,724, issued to Scarra et al., entitled "Operational Analysis Device of the Scan Path Type Having a Single Scanning Clock and a Single Output Phase for an Integrated Circuit," discloses a system that provides two clocks, a scan clock and a system clock, in order to overcome the balancing issues inherent in such designs. Such a system, however, has significant drawbacks because the addition of a second clock, adds, rather than reduces, timing complexities to the system.

Thus, a need exists to provide a simplified system of clock control for LBIST systems without creating significant intrusion on oscillator wave form, imparting additional clock skew, or requiring system data path reduction for at-speed scan operation. All of the above references are hereby incorporated by reference.

DISCLOSURE OF INVENTION

According to the present invention, an improved system for implementing built-in self-test clock control is disclosed. The system comprises a clock control logic unit that includes as inputs an oscillator clock signal and an LSSD testing input signal. The clock control logic unit comprises outputs that include a plurality of enable signals. The enable signals generated from the clock control logic unit are thereafter inputted into a data/clock distribution tree means adapted to distribute the enable signals to a local clock splitting device. The distribution tree means (or clock powering logic) also receives an oscillator signal and distributes it locally to the clock splitting device. The local clock splitting device, through the use of some basic logic circuitry, generate a plurality of clock signals. These clock signals may be utilized to drive a scan chain of master/slave latches utilized in LBIST testing.

The clock control logic unit may be set up such that it can control or generate an A_enb signal, a C_enb signal, a B_enb signal, and a scan gate signal. The data/clock distribution tree means may comprise an A tree for distributing the A_enb, a C tree for distributing the C_enb, a B tree for distributing the B_enb, a scan gate tree for distributing the scan gate signal and a clock tree for distributing the oscillator signal. The clock splitting device may be configured to generate an A clock signal, a C clock signal, and a B clock signal. The A clock or scan master clock is utilized under LSSD test mode as a direct clock input needed for LSSD operations and under system scan mode as the master clock. The C clock, or system master clock, is utilized as a direct clock input for LSSD operations or functions as the master clock under normal operations. Finally, the B clock, or slave clock, functions as a direct clock input under LSSD operations, a system slave clock under normal operations, and a slave scan clock under system scan mode.

The system further comprises a combinational logic means operatively connected to at least one of the master/slave latching means such that data can be transferred from a slave latching means into the combinational logic means and then transferred back to a subsequent master latching means.

In accordance with the above, it is an advantage of the present invention to provide a system wherein only a signal clock powering tree is required.

In accordance with the above, it is a further advantage of the present invention to provide a system wherein only a minimal intrusion on the oscillator wave form occurs and clock enabling gating is inherent in the clock splitting function.

In accordance with the above, it is a further advantage of the present invention to provide at-speed scan operation that does not require system data path reduction.

In accordance with the above, it is a further advantage of the present invention to provide reduced speed scan capabilities with no additional clock intrusion.

In accordance with the above, it is a further advantage of the present invention to provide leaf clock splitter functionality for control of the A clock with LSSD testability retained for all LSSD clocks.

In accordance with the above, it is a further advantage of the present invention to provide a system that allows for normal product operational mode.

In accordance with the above, it is a further advantage of the present invention to provide the ability to stop and start the clocks, to provide for one or more capture then launch test cycles, and to provide for one or more launch then capture test cycles.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings where like designations denote like elements, and.

BEST MODE FOR CARRYING OUT THE INVENTION

Figure 1:
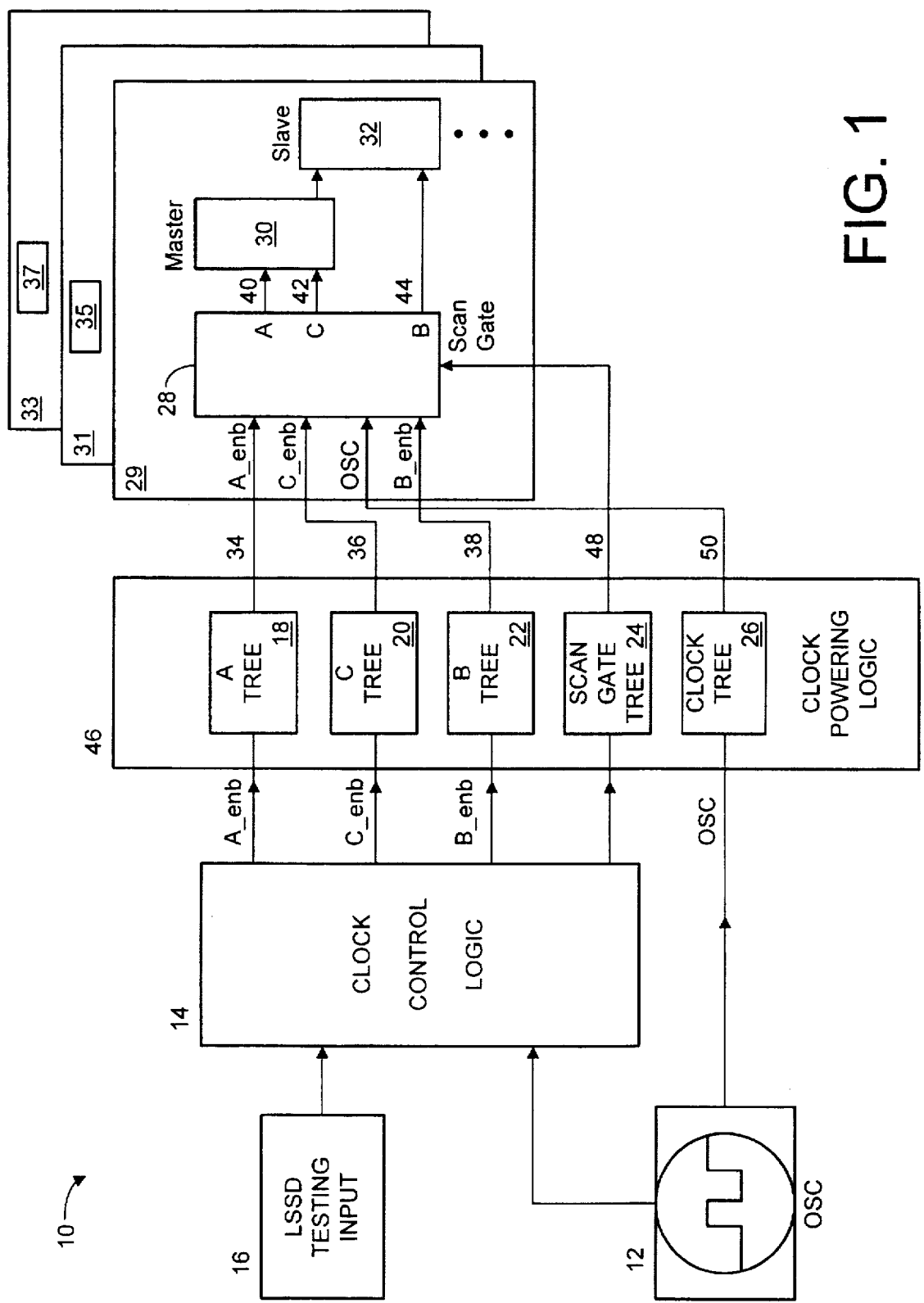
FIG. 1 is block diagram of a LBIST system utilizing LSSD master slave control with an enhanced leaf clock splitter.

Referring now to the drawings, FIG. 1 depicts a high-level circuit diagram 10 with improved clock control which incorporates LSSD master slave control with a plurality of enhanced leaf clock splitters 28, 35 and 37. Unlike past designs, this embodiment features a system wherein LSSD clock signals 40, 42 & 44 are created after the clock powering logic 46. The result is a system wherein the oscillator clock is manipulated or split at one or more remote or "leaf" levels 29, 31 and 33 as opposed to being manipulated or split only once at the system or "tree" level.

The present embodiment utilizes a single oscillator 12 which generates a clock signal that drives the clock control logic 14 and a clock tree 26. The clock control logic 14 (also referred to as an enabling signal generator) generates several enable signals and one scan gate signal to the clock powering logic 46 (also referred to as a signal distribution means or distribution tree), which in turn distributes the signals to one or more enhanced leaf clock splitters 28, 35 and 37 (also referred to as a remote pulse generator). Pursuant to this technique of LSSD testing, the A_enb signal comprises LSSD test information resulting from LSSD test data 16 that was originally inputted into the clock control logic 14. Furthermore, because an LSSD latch configuration 30, 32 is utilized, "at-speed" scan operation does not require system data path reduction.

Both the clock control logic 14 and clock powering logic 46 comprise circuitry similar to that known in the art. However, it should be recognized that under this embodiment the A, C & B enable trees 18, 20 & 22 need not be "balanced" with the type of precision disclosed in prior art systems. This is because the enable trees function as "data trees" (which distribute data signals) as opposed to "clock trees" (which distribute clock signals). Thus, highly precise timing is not a critical design issue at the powering logic stage 46 for the enable trees 18, 20 and 22. This advantage is discussed in further detail below with respect to the timing diagram shown in FIG. 3.

The enhanced leaf clock splitter 28, 35 and 37 receive four control input signals (A_enb 34, C_enb 36, B_enb 38 and scan gate 48), along with a clock signal 50. Depending upon the control signal inputs, the clock splitter 28 can output a Scan Master 40, System Master 42 and Slave Clock 44 (i.e., the "A," "C" and "B" LSSD clocks). The LSSD clock signals in turn transfer data to a scan chain comprised of a plurality of master-slave 20 latches 30, 32. It is envisioned that each splitter may control a small number of latches (e.g. 10-20). Under a launch-capture test cycle, data is transferred from a slave latching means 32 into a combinational logic circuit (FIG. 4) during a first "pulse" signal and from the combinational logic circuit to a master latching means during a second "pulse" signal.

Figure 2:
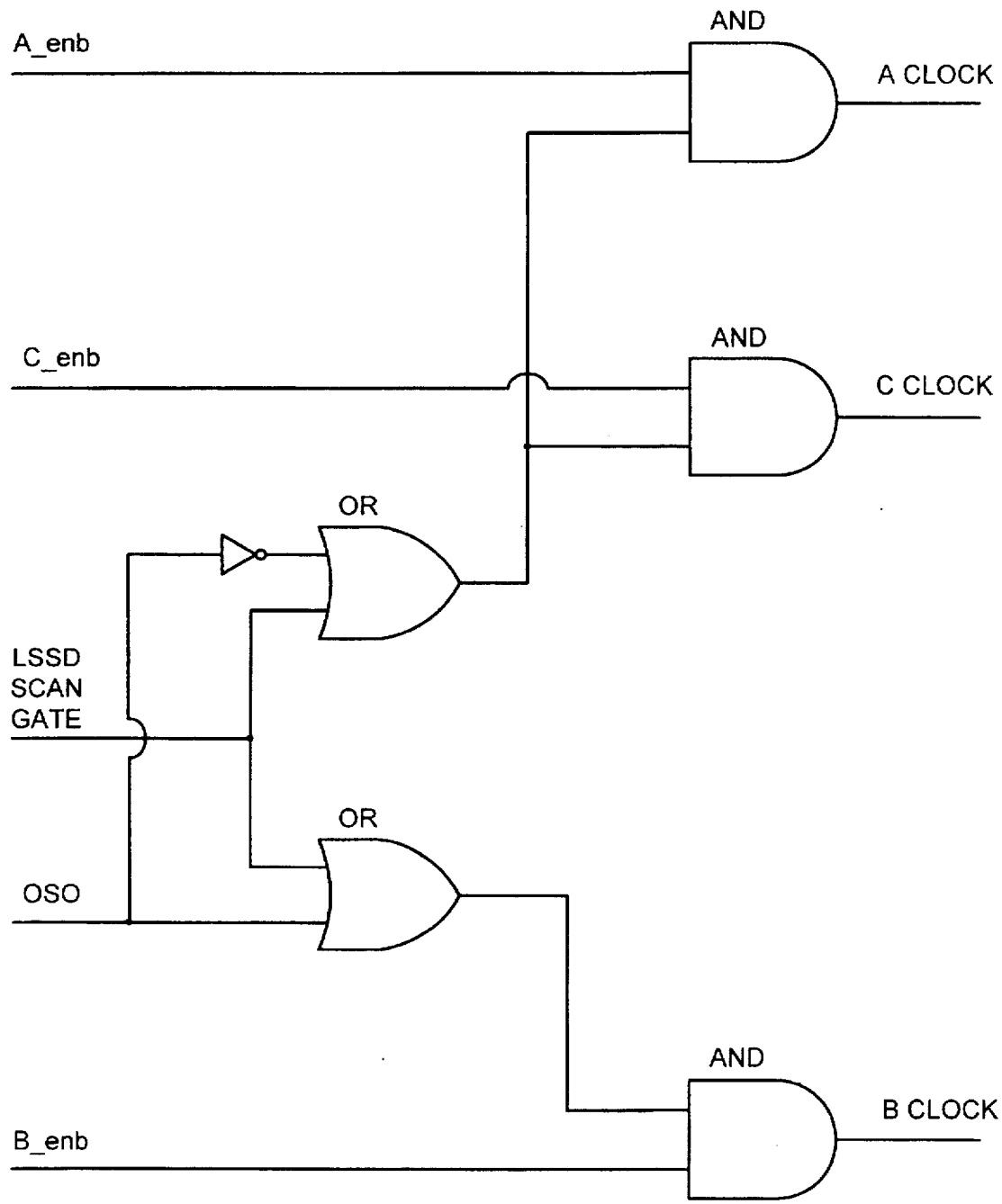
FIG. 2 is a logic diagram of one specific implementation of the enhanced leaf clock splitter of FIG. 1.

The four input control signals 34, 36, 38 and 48 allow the splitters 28, 35 and 37 to operate in three modes: LSSD test/scan mode; system normal/test mode; and system scan mode. Under LSSD test/scan mode, the A_enb, C_enb and B_enb signals become the direct A, C and B clock inputs needed for LSSD operations. Under system normal/test mode, the oscillator is split into Master and slave system clocks (C and B) under control of C_enb and B_enb. Under system scan mode, the oscillator is split into master and slave scan clocks (A and B) under control of A_enb and B_enb. FIG. 2 describes in further detail the functionality of the clock splitter 28.

Referring now to FIG. 2, an Enhanced Leaf Clock Splitter logic diagram 28 is shown. The splitter 28 comprises the five inputs (A_enb, C_enb, OSC, LSSD scan gate and B_enb) and three output clock signals (A, B and C). Under System mode, A_enb=0, C_enb=1, B_enb=1 and scan gate=0. Thus, A is always 0, C is an inverted oscillator clock signal, and B is the clock signal OSC. The clock signal can be stopped by setting C_enb=0 on the rising edge of OSC and B_enb=0 on the next falling edge of OSC. The clocks can then be started by setting C_enb=1 on the rising edge of OSC and B_enb=1 on the next falling edge of OSC.

The system can be operated in capture/launch mode by setting C_enb=1 for n cycles using the rising edge of OSC and setting B_enb=1 for n cycles using the falling edge of OSC immediately following the C_enb rising edge. Alternatively, the system can be operated in launch/capture mode by setting C_enb=1 for n cycles using the rising edge of OSC and setting B_enb=1 for n cycles using the falling edge of OSC immediately preceding the C_enb rising edge.

While FIG. 2 depicts a preferred embodiment for a clock splitting device, it is recognized that many variations could be introduced to achieve similar functionality. Thus, depending upon system requirements, the configuration depicted therein may be altered to achieve the desired result.

Figure 3:
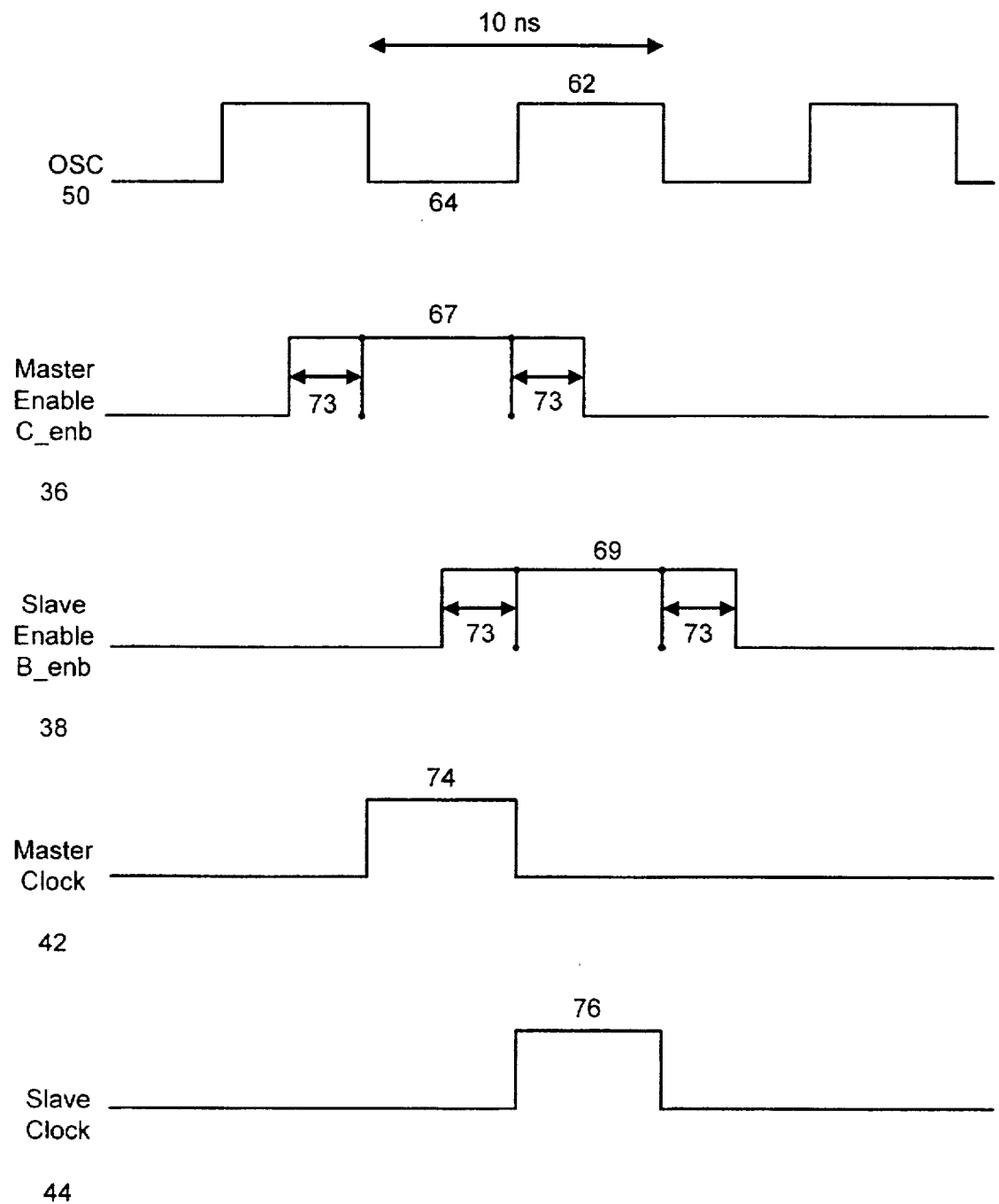
FIG. 3 is a timing diagram showing the operation of the enhanced leaf clock splitter of FIGS. 1 and 2.

Referring now to FIG. 3, a timing diagram is shown depicting the operation of the enhanced leaf clock splitter 28 of FIGS. 1 and 2. The oscillator clock signal OSC 50 comprises a sequence of cycles, each with a high level 62 and a low level 64. When the master enable signal C_enb 36 is at a high level, the master clock 42 will be the inverse of the oscillator clock signal (OSC) 50. Furthermore, when the slave enable B_enb 38 is at a high level, the slave clock will be identical to the oscillator clock signal (OSC) 50.

For a 100 MHz oscillator, a clock cycle will last 10 nanoseconds, 5 nanoseconds during the high level 62 and 5 nanoseconds for the low level 64. For a typical high performance system, the balancing window (i.e., margin of error) of the oscillator clock signal must be less than 500 picoseconds in order to maintain system performance. However, with respect to the A_enb, C_enb and B_enb trees, tight balancing is not a requirement due to the fact that these signals are data signals rather than clock signals. Since the clock signal is being split locally at the "leaf" level 28, only a single system clock is required at the "tree" level 46 (see FIG. 1). In contrast, known systems that split the clock signal at or before the "tree" level must deal with the additional balancing requirements of having two or more system clock trees.

To illustrate, in the present embodiment the balancing window 73 of a Master Enable (C_enb) pulse 67 or Slave Enable (B_enb) pulse 68 may be as much as 2.5 nanoseconds on each side of the pulse. Thus, even though multiple data trees are required in the present embodiment, the need for precise balancing is removed in all but the oscillator signal 50. Furthermore, since the Scan Gate Tree 24 (see FIG. 1) is used only in LSSD test operation mode, it is not critical from a clock tree balancing standpoint.

Figure 4:
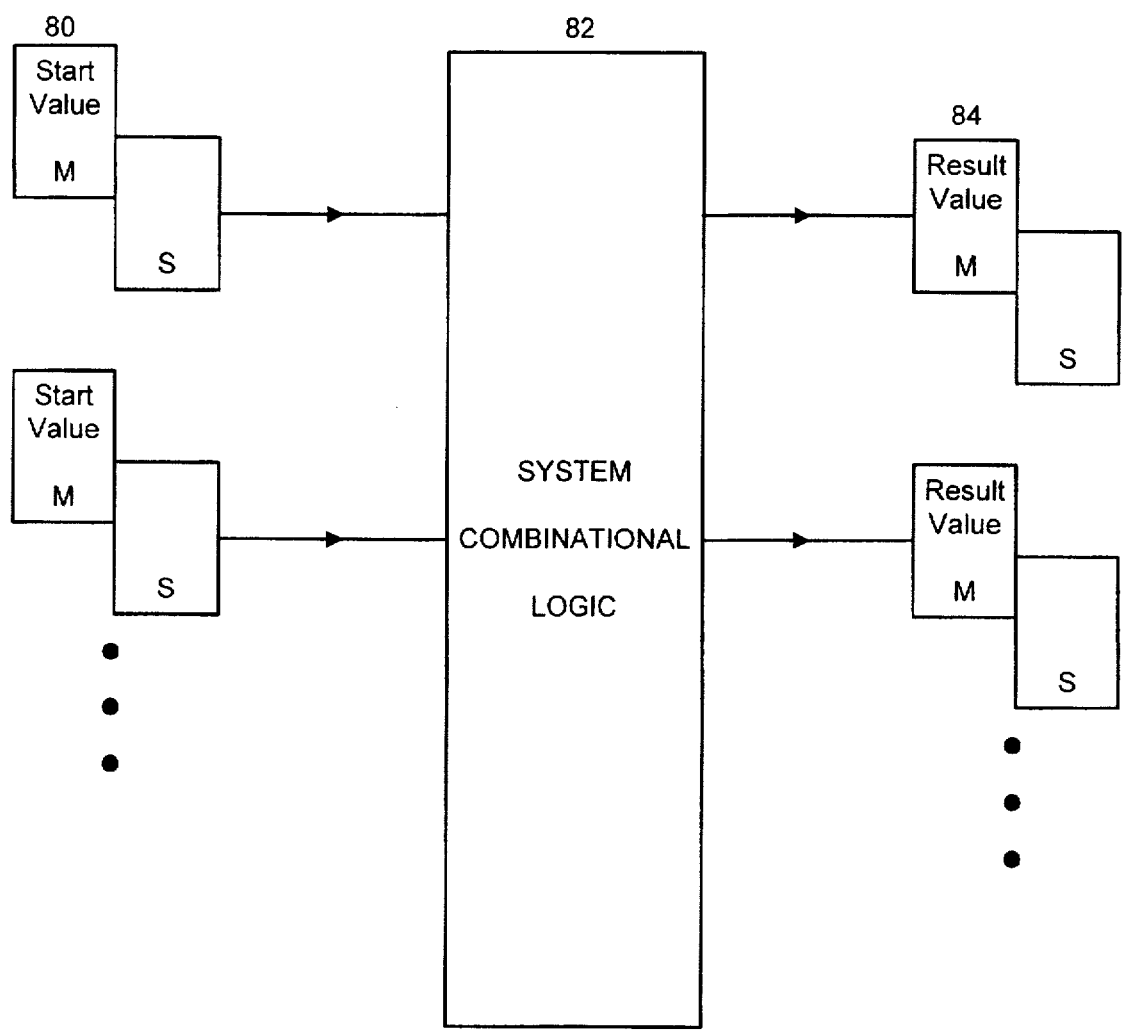
FIG. 4 is a high level diagram depicting an LBIST system.

FIG. 4 depicts a high level overview of a typical LBIST test cycle. During a scan operation, data is transferred from a first master/slave latching means 80 into a combinational logic circuit 82 during a first pulse, (e.g. pulse 76 of FIG. 3).

The data is then acted upon in the combinational logic circuit 82 for a full cycle and then outputted to a subsequent master/slave latching means 84 during a second pulse (e.g. pulse 74 of FIG. 3).

The foregoing description of the preferred embodiments of the invention have been presented for purposes of illustration and description. It is not intended to be exhaustive or to limit the invention to the precise form disclosed, and obviously many modifications and variations are possible in light of the above teachings. Such modifications and variations that may be apparent to a person skilled in the art are intended to be included within the scope of this invention as defined by the accompanying claims.

I claim:

1. A semiconductor integrated circuit comprising:
   a) an enabling signal generator;
   b) signal distribution means for remotely distributing a plurality of enabling signals generated by said enabling signal generator and for remotely distributing a single externally applied oscillator clock signal; and
   c) a plurality of remote pulse signal generators, wherein each said remote pulse signal generator includes means for receiving said plurality of enabling signals and said single externally applied oscillator clock signal from said signal distribution means and selectively outputting either a first pulse signal substantially identical in time and duration to a high level of said externally applied oscillator clock signal over a first output line, or a second pulse signal substantially identical in time and duration to a low level of said externally applied oscillator clock signal over a second output line, or both said first and second pulse signals.

2. The semiconductor integrated circuit of claim 1 wherein each said remote pulse signal generator further includes means for generating said first and second pulse signals within a single clock cycle of said single externally applied oscillator clock signal.

3. The semiconductor integrated circuit of claim 1 wherein each said remote pulse signal generator further includes means for generating said first pulse when a first enabling signal of said plurality of enabling signals is enabled and means for generating said second pulse signal when a second enabling signal of said plurality of enabling signal is enabled.

4. The semiconductor integrated circuit of claim 2 further comprising at least one scan chain comprised of a master latch and a slave latch wherein said first pulse signal controls said master latch and said second pulse signal controls said slave latch.

5. The semiconductor integrated circuit of claim 1 further comprising a plurality of master-slave latches receiving said first and second pulse signals and a combinational logic operatively connected to said plurality of master-slave latches.

6. The semiconductor integrated circuit of claim 5 wherein said second pulse signal causes data to be launched from a first master-slave latch into said combinational logic and said first pulse signal causes data to be captured from said combinational logic into a second master-slave latch.

7. A system for implementing built-in self test clock control comprising:
   a) a clock control logic unit with input lines for receiving an externally generated oscillator clock signal and a testing input, and output lines for outputting a plurality of control signals;
   b) a signal distribution tree with input lines for receiving said plurality of control signals and said externally generated oscillator clock signal and output lines for outputting said plurality of control signals and said externally generated oscillator clock signal to a plurality of remote locations; and c) a plurality of clock splitting devices located at said plurality of remote locations, each of said clock splitting devices comprising input lines for receiving said plurality of control signals and said externally generated oscillator clock signal, and a first output line for selectively outputting a first pulse signal substantially identical in time and duration to a low level of a clock cycle of said externally generated oscillator clock signal and a second output line for selectively outputting a second pulse signal substantially identical in time and duration to a high level of said clock cycle of said externally generated oscillator clock signal.

8. The system of claim 7 wherein each of said clock splitting devices further comprises a third output line for selectively outputting a third pulse signal substantially identical in time and frequency of said externally generated clock signal said second and third output lines providing signals for performing at-speed scan operation.

9. The system of claim 7 wherein said plurality of control signals comprises a scan gate signal.

10. The system of claim 8 wherein said first, second and third pulse signals comprise a master clock signal, a slave clock signal and a scan clock signal, respectively.

11. The system of claim 7 wherein said first and second pulse signals are inputted into a scan chain having a master latch and a slave latch.

12. The system of claim 11 wherein a high level of said oscillator clock signal will cause data to be transferred from said slave latch into a combinational logic circuit and a low level of said oscillator clock signal will cause data to be transferred from said combinational logic circuit into said master latch.

13. A method for implementing remote clock control comprising the steps of:

generating an oscillator clock signal, said oscillator clock signal having a plurality of clock cycles wherein each clock cycle includes a first and second level;

generating a plurality of enabling signals;

remotely distributing said plurality of enabling signals and said oscillator clock signal to a plurality of remote locations;

at each of said plurality of remote locations, inputting said plurality of remotely distributed enabling signals and said remotely distributed oscillator clock signal into a remote clock splitting device;

selectively outputting from each said remote clock splitting device a first pulse signal over a first output line that is substantially identical in time and duration to the first level of a captured clock cycle of said oscillator clock signal; and selectively outputting from each said remote clock splitting device a second pulse signal over a second output line substantially identical in time and duration to the second level of said captured clock cycle of said oscillator clock signal.

14. The method of claim 13 wherein said plurality of remotely distributed enabling signals includes LSSD test data.

15. The method of claim 13 further comprising the step of inputting said first and second pulse signals into a scan chain comprised of master-slave latches.

16. The method of claim 13 wherein said first pulse signal comprises an inverted oscillator clock signal.

* * * * *

UNITED STATES PATENT AND TRADEMARK OFFICE
CERTIFICATE OF CORRECTION

PATENT NO. : 5,783,960
DATED : Jul. 21, 1998
INVENTOR(S) : Lackey et al.

It is certified that error appears in the above-identified patent and that said Letters Patent is hereby corrected as shown below:

Column 2, line 38, delete "Scarra et aL," and insert -- Scarrá et al., --
Column 4, line 47, delete "splitter" and insert -- splitters --.
Column 4, line 50, delete "splitter 28" and insert -- splitters 28, 35 & 37--.
Column 4, line 55, after "splitter" insert -- 28, 35 & 37 --.

Claim 3, line 44, delete "signal" and insert -- signals --.

Signed and Sealed this

Twenty-fourth Day of November, 1998

Attest:

BRUCE LEHMAN

Attesting Officer

Commissioner of Patents and Trademarks